US009799799B2

(12) United States Patent
Hashimoto (10) Patent No.: US 9,799,799 B2
(45) Date of Patent: Oct. 24, 2017

(54) LIGHT EMITTING DEVICE AND METHOD OF MANUFACTURING THE SAME

(71) Applicant: NICHIA CORPORATION, Anan-shi (JP)

(72) Inventor: Toru Hashimoto, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/447,754

(22) Filed: Mar. 2, 2017

(65) Prior Publication Data
US 2017/0256674 A1 Sep. 7, 2017

(30) Foreign Application Priority Data
Mar. 2, 2016 (JP) .................................. 2016-040426

(51) Int. Cl.
| H01L 33/00 | (2010.01) |
| H01L 33/08 | (2010.01) |
| H01L 33/50 | (2010.01) |

(52) U.S. Cl.
CPC .............. *H01L 33/08* (2013.01); *H01L 33/50* (2013.01); *H01L 2933/0016* (2013.01)

(58) Field of Classification Search
CPC .......... H01L 33/60; H01L 33/56; H01L 33/50; H01L 33/0095
See application file for complete search history.

(56) References Cited

U.S. PATENT DOCUMENTS

| 2011/0284822 A1* | 11/2011 | Jung ...................... H01L 33/505 257/13 |
| 2011/0297969 A1 | 12/2011 | Kojima et al. |
| 2013/0329440 A1 | 12/2013 | Tsutsumi et al. |
| 2016/0093781 A1 | 3/2016 | Tamaki et al. |
| 2016/0293810 A1* | 10/2016 | Baike ....................... H01L 33/40 |
| 2016/0351760 A1* | 12/2016 | Hayashi .................. H01L 33/58 |
| 2016/0351765 A1* | 12/2016 | Suzuki .................... H01L 33/60 |
| 2017/0141272 A1* | 5/2017 | Park ....................... H01L 33/483 |

FOREIGN PATENT DOCUMENTS

| JP | 2010-157638 | 7/2010 |
| JP | 2011-254033 | 12/2011 |
| JP | 2012-134355 | 7/2012 |
| JP | 2012-169189 | 9/2012 |
| JP | 2015-195294 | 11/2015 |
| JP | 2016-072466 | 5/2016 |
| JP | 2016-072471 | 5/2016 |

* cited by examiner

*Primary Examiner* — Trung Q Dang
(74) *Attorney, Agent, or Firm* — Mori & Ward, LLP (57) ABSTRACT

A light emitting device includes: a light emitting element that includes a light extracting surface, an electrode formed surface opposite to the light extracting surface, one or more lateral surfaces, and a pair of electrodes positioned on the electrode formed surface; a light-transmissive member that includes a light entering surface, a light exiting surface opposite to the light entering surface, and one or more lateral surfaces, the light entering surface being disposed on the light extracting surface; an insulating member that covers the lateral surfaces and the electrode formed surface of the light emitting element, and is disposed to expose at least part of the pair of electrodes; a first metal layer that covers the lateral surfaces of the light-transmissive member; and a second metal layer that covers the lateral surfaces of the light emitting element interposing the insulating member.

17 Claims, 8 Drawing Sheets

FIG. 11G

LIGHT EMITTING DEVICE AND METHOD OF MANUFACTURING THE SAME

CROSS-REFERENCE TO RELATED APPLICATION

This application claims priority to Japanese Patent Application No. 2016-040,426, filed on Mar. 2, 2016. The contents of this application are incorporated herein by reference in their entirety.

BACKGROUND

1. Field of the Invention

The present disclosure relates to a light emitting device and a method of manufacturing the same.

2. Description of Related Art

Being small in power consumption, light emitting devices using a semiconductor light emitting element are actively used for various purposes including backlight, automotive products, electric billboards, traffic signs, and other general lighting devices. For a certain purpose, a light emitting device with good distinguishability is required. Good distinguishability refers to a great difference in contrast between a light emitting region and a non light emitting region. In order to improve the distinguishability of the light emitting region, the light emitting region is surrounded by a reflecting member. Such a reflecting member is made of, for example, resin mixed with titanium oxide.

Whereas, there is a demand for thinner and downsized electronic devices of various types. In order to meet the demand of downsizing of the light emitting device, it is known to reduce a thickness of the reflecting member covering around the light emitting region.

SUMMARY

A light emitting device according to one embodiment of the present disclosure includes: a light emitting element that includes a light extracting surface, an electrode formed surface opposite to the light extracting surface, one or more light emitting element lateral surfaces positioned between the light extracting surface and the electrode formed surface, and a pair of electrodes positioned on the electrode formed surface; a light-transmissive member that includes a light entering surface, a light exiting surface opposite to the light entering surface, and one or more light-transmissive member lateral surfaces positioned between the light entering surface and the light exiting surface, the light entering surface being disposed on the light extracting surface; an insulating member that covers the one or more light emitting element lateral surfaces and the electrode formed surface of the light emitting element, and is disposed to expose at least part of the pair of electrodes; a first metal layer that covers the one or more light-transmissive member lateral surfaces of the light-transmissive member; and a second metal layer that covers the one or more light emitting element lateral surfaces of the light emitting element interposing the insulating member.

A method of manufacturing a light emitting device according to one embodiment of the present disclosure includes: providing a covering member that includes a light-transmissive member that includes a light entering surface, a light exiting surface opposite to the light entering surface, and one or more light-transmissive member lateral surfaces positioned between the light entering surface and the light exiting surface, and a first metal layer that covers the one or more light-transmissive member lateral surfaces of the light-transmissive member; joining a light extracting surface of a light emitting element and the light entering surface to each other, the light emitting element including the light extracting surface, an electrode formed surface opposite to the light extracting surface, one or more light emitting element lateral surfaces positioned between the light extracting surface and the electrode formed surface, and a pair of electrodes provided on the electrode formed surface; forming an insulating member to cover the one or more light emitting element lateral surfaces and the electrode formed surface of the light emitting element; forming a second metal layer on a surface of the insulating member; and removing the insulating member and the second metal layer that cover the electrode formed surface to expose the pair of electrodes.

BRIEF DESCRIPTION OF THE DRAWINGS

A more complete appreciation of the invention and many of the attendant advantages thereof will be readily obtained as the same becomes better understood by reference to the following detailed description when considered in connection with the following accompanying drawings.

DETAILED DESCRIPTION OF EMBODIMENTS

In the following, embodiments of the present invention will be described with reference to the drawings. However, the following embodiments are merely examples for embodying the technical idea of the present invention, and the present invention is not limited thereto. Further, the present specification is not intended to limit members shown in the scope of claims for patent to members in the embodiments. In particular, unless otherwise specified, the dimension, material, shape, and relative disposition of the constituents described in the embodiments are not intended to limit the scope of the present invention only thereto. Note that, the size or positional relationship of members shown in the drawings may be exaggerated for the sake of clarity. Further, in the following description, identical names and reference characters refer to the identical or similar members, and detailed descriptions are omitted as appropriate. Further, the elements structuring the present invention may be in a manner in which a plurality of elements is structured by an identical member such that one member has the function of the plurality of elements. Conversely, a plurality of members may share the functions of one member. Further, any content described in one Example or embodiment may hold true for other Example or embodiment. Still further, in the present specification, the term "on/above" used in relation to a layer or the like does not always mean the manner of an element being formed in contact with the upper surface, and includes the manner of an element being formed above the upper surface with a distance therefrom, with or without any interposed layer.

Certain embodiments of the present disclosure is to provide a light emitting device in which leakage of light from its lateral surface is alleviated, and a method of manufacturing the same.

First Embodiment

Figure 1:
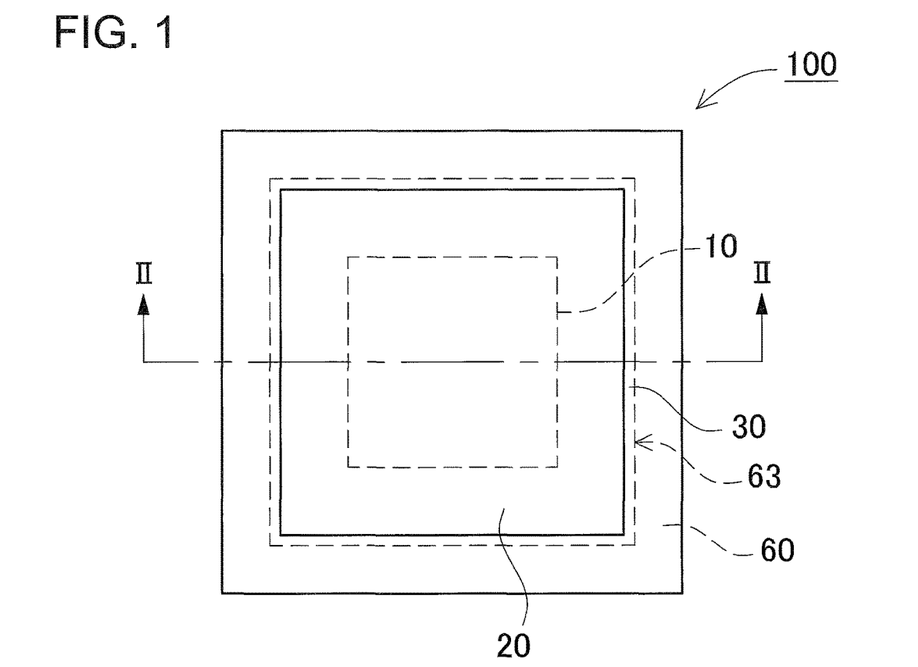
FIG. 1 is a plan view of a light emitting device according to a first embodiment.
Figure 2:
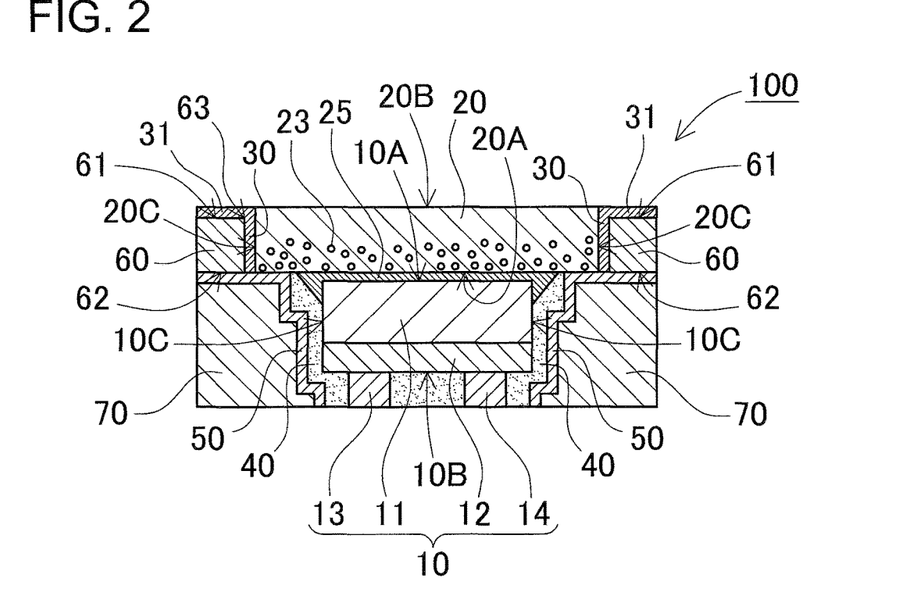
FIG. 2 is a cross-sectional view taken along line II-II of the light emitting device shown in FIG. 1.

FIGS. 1 and 2 show a light emitting device according to a first embodiment. FIG. 1 is a plan view of a light emitting device 100. FIG. 2 is a cross-sectional view of the light emitting device 100. The light emitting device 100 includes a light emitting element 10, a light-transmissive member 20, an insulating member 40, a first metal layer 30, a second metal layer 50, a first protective member 60, and a second protective member 70. The light emitting element 10 includes a light extracting surface 10A, an electrode formed surface 10B being opposite to the light extracting surface 10A, one or more lateral surfaces 10C provided between the light extracting surface 10A and the electrode formed surface 10B, and a pair of electrodes 13, 14 provided at the electrode formed surface 10B. The light-transmissive member 20 includes a light entering surface 20A, a light exiting surface 20B opposite to the light entering surface 20A, and one or more lateral surfaces 20C provided between the light entering surface 20A and the light exiting surface 20B. The light-transmissive member 20 has its light entering surface 20A disposed above the light extracting surface 10A of the light emitting element 10. The insulating member 40 is disposed so as to cover the lateral surfaces 10C and the electrode formed surface 10B of the light emitting element 10 and expose at least part of each of the electrodes 13, 14. The first metal layer 30 covers the lateral surfaces 20C of the light-transmissive member 20. The second metal layer 50 covers the lateral surfaces 10C of the light emitting element 10 interposing the insulating member 40. The first protective member 60 includes a through hole 63. The inner surface of the through hole 63 is covered with the first metal layer 30. The second protective member 70 covers the lateral surfaces 10C of the light emitting element interposing the second metal layer 50.

Light Emitting Element 10

The light emitting element 10 includes a light-transmissive substrate 11, a semiconductor layered body 12, and the pair of electrodes 13, 14 provided on an identical surface of the semiconductor layered body 12. The surface of the light emitting element 10 where the pair of electrodes 13, 14 are provided is the electrode formed surface 10B, and the surface opposite to the electrode formed surface 10B is the light extracting surface 10A. Accordingly, the light extracting surface 10A being one surface of the light-transmissive substrate 11 allows light from the semiconductor layered body 12 to be extracted. The shape of each of the electrodes 13, 14 may be any of various shapes, such as substantially rectangular or circular. The material of the pair of electrodes 13, 14 may at least be electrically conductive, and any known material can be employed.

A peak wavelength of the light emitting element 10 may be appropriately selected depending on the intended use. For example, a nitride semiconductor of which peak wavelength is from 430 nm to 490 nm may be employed for the light emitting element. The nitride semiconductor may be $In_X Al_Y Ga_{1-X-Y} N$ ($0 \leq X$, $0 \leq Y$, $X+Y \leq 1$) or the like.

Light-Transmissive Member 20

The light-transmissive member 20 is disposed on the light extracting surface 10A of the light emitting element 10 to protect the light emitting element 10 from the external environment. The light-transmissive member 20 is formed by light-transmissive resin, glass, or an inorganic substance, and structured to allow light entering from the light emitting element 10 to transmit through and exit to the outside. The light-transmissive member 20 shown in FIG. 2 is formed to be plate-like shape. The surface of the light-transmissive member 20 facing to the light extracting surface 10A of the light emitting element 10 is the light entering surface 20A, and the surface opposite thereto is the light exiting surface 20B. The thickness of the light-transmissive member 20 is preferably 10 µm to 500 µm, and further preferably from 50 µm to 300 µm.

In the light emitting device 100 shown in FIG. 1, the outer edge of the light-transmissive member 20 as seen in a plan view, that is, the outer edge of the light entering surface 20A, is set to be greater than the outer edge of the light emitting element 10 as seen in a plan view, that is, the outer edge of the light extracting surface 10A. The light-transmissive member 20 shown in FIG. 1 is disposed such that the light extracting surface 10A of the light emitting element 10 is positioned substantially at the center of the light-transmissive member 20, as seen in a plan view. In other words, as shown in a cross-sectional view of FIG. 2, the lateral surfaces 20C of the light-transmissive member 20 are positioned outer than the lateral surfaces 10C of the light emitting element 10. Thus, the light from the light emitting element 10 can be received by the light entering surface 20A being wider than the light extracting surface 10A of the light emitting element 10. Consequently, the light extraction efficiency can improve. Preferably, an area of the light-transmissive member 20 as seen in a plan view is at least greater than an area of the light emitting element 10 and smaller than twice the area of the light emitting element 10 as seen in a plan view. In the case where the lateral surfaces 20C of the light-transmissive member 20 are positioned outer than the lateral surfaces 10C of the light emitting element 10 as seen in a cross-sectional view, preferably the shortest distance between the lateral surfaces 20C of the light-transmissive member 20 and the lateral surfaces 10C of the light emitting element 10 are each, for example, in a range of 3% to 30% relative to a width of the light emitting element 10 as seen in a cross-sectional view, and specifically in a range of 5% to 15% relative thereto. The width of the light emitting element 10 is a length of the light emitting element 10 in a direction perpendicular to the lateral surfaces 10C. Preferably the shortest distance between the lateral surfaces 20C of the light-transmissive member 20 and the lateral surfaces 10C of the light emitting element 10 are each in a range of 1 µm to 50 µm. When a joining member 25 which will be described later is included in the light emitting device 100, as seen in a cross-sectional view, the lateral surfaces 20C of the light-transmissive member 20 is preferably positioned outer than the joining member 25.

The light-transmissive resin may be thermosetting resin such as silicone resin, silicone modified resin, epoxy resin, and phenolic resin, thermoplastic resin such as polycarbonate resin, acrylic resin, methylpentene resin, and polynorbornene resin. In particular, silicone resin exhibiting good light resistance and heat resistance is suitable. Further, in order to impart desired characteristics to the light-transmissive resin, additives may be added to the light-transmissive resin. For example, in order to reduce non-uniform luminance, a light reflecting material that reflects light from the light emitting element may be added to the light-transmissive resin.

Wavelength Conversion Member 23

Further, the light-transmissive member 20 shown in FIG. 2 contains a wavelength conversion member 23. The wavelength conversion member 23 is configured with particles that convert the peak wavelength of light emitted from the light emitting element 10 to a different peak wavelength. The wavelength conversion member 23 contained in the light-transmissive member 20 may be positioned in high density at the light entering surface 20A side inside the light-transmissive member 20. For example, the wavelength conversion member 23 can be positioned in high density at the light entering surface 20A side inside the light-transmissive member 20 by natural settling (i.e., settling by its own weight) or forced settling (i.e., settling by external exertion). Forced sedimentation may be centrifugal settling, for example. The light-transmissive member 20 is formed by adding the wavelength member into a base material in high density at the light entering surface 20A side, thereafter curing a base material containing the wavelength member by, for example, heating. The wavelength conversion member can be disposed denser on the light exiting surface 20B of the light-transmissive member 20.

The wavelength conversion member 23 may be a fluorescent material that can be excited by light from the light emitting element. For example, a fluorescent material that can be excited by a blue-color light emitting element or an ultraviolet light emitting element may be: a cerium-activated yttrium-aluminum-garnet-based fluorescent material (Ce:YAG); a cerium-activated lutetium-aluminum-garnet-based fluorescent material (Ce:LAG); an europium and/or chromium-activated nitrogen-containing calcium aluminosilicate-based fluorescent material ($CaO—Al_2O_3—SiO_2$); an europium-activated silicate-based fluorescent material (($Sr,Ba)_2SiO_4$); a nitride-based fluorescent material such as a β SiAlON fluorescent material, a CASN-based fluorescent material and a SCASN-based fluorescent material; a fluoride-based fluorescent material such as a KSF-based fluorescent material; a sulfide-based fluorescent material; a chloride-based fluorescent material; a silicate-based fluorescent material; a phosphate-based fluorescent material; a quantum dot fluorescent material and the like. A general formula of a KSF-based fluorescent material can be represented by $A_2[M_{1-a}Mn^{4+}{}_aF_6]$ . . . (I) (where "A" is at least one cation selected from the group consisting of $K^+$, $Li^+$, $Na^+$, $Rb^+$, $Cs^+$ and $NH_4^+$, "M" is at least one element selected from Group 4 elements and Group 14 elements, and "a" satisfies $0.01<a<0.20$). The wavelength conversion member 23 may be a fluoride-based fluorescent material represented by general formula (I) where "A" includes $K^+$ and "M" includes Si. Combining such fluorescent materials and a blue-color light emitting element or an ultraviolet light emitting element, light emitting devices of various wavelengths can be manufactured. Here, a thickness of the light-transmissive member 20 containing the wavelength conversion member is determined by the type and content of a wavelength conversion member for realizing light in desired color.

Joining Member 25

The light entering surface 20A of the light-transmissive member 20 and the light extracting surface 10A of the light emitting element 10 are disposed so as to face each other. A light-transmissive joining member 25 is interposed between the light emitting element 10 and the light-transmissive member 20, to fix the light emitting element 10 and the light-transmissive member 20 to each other. The joining member 25 preferably covers at least part of the lateral surfaces 10C of the light emitting element 10. With this configuration, light reaching the lateral surfaces 10C of the light emitting element 10 is less likely to be reflected by the lateral surfaces 10C of the light emitting element 10 and degraded within the light emitting element 10, thereby facilitating such light to be extracted to the outside of the light emitting element 10 through the joining member 25. This improves the light extraction efficiency of the light emitting device.

The joining member 25 is preferably made of a light-transmissive material capable of coupling the light emitting element 10 and the light-transmissive member 20 to each other. The material of the joining member 25 may be thermosetting light-transmissive resin such as silicone resin, silicone modified resin, epoxy resin, and phenolic resin. An exemplary material of the joining member 25 is a light-transmissive adhesive agent such as silicone resin. Further, since the joining member 25 is in contact with the light emitting element 10, the joining member 25 is susceptible to heat generated by the light emitting element 10 when the light emitting element 10 is turned on. The thermosetting resin exhibits good heat resistance, and therefore suitable for the joining member 25. In order to impart desired characteristics, any additive may be added to the joining member 25. For example, in order to adjust the refractive index of the joining member 25, or to adjust the viscosity of the joining member 25 before being cured, various types of filler may be added.

First Metal Layer 30

The first metal layer 30 covers the lateral surfaces 20C of the light-transmissive member 20. The first metal layer 30 shown in FIG. 2 covers the entire lateral surfaces 20C of the light-transmissive member 20. Provision of the first metal layer 30 alleviates leakage of light from the lateral surfaces 20C of the light-transmissive member 20. The metal material is less likely to transmit light as compared to resin mixed with titanium oxide or ceramic. Accordingly, the first metal layer 30 can alleviate leakage of light from the lateral surfaces of the light emitting device while being thinner than a layer made of resin mixed with titanium oxide or ceramic. This provides the downsized light emitting device being capable of alleviating leakage of light from its lateral surfaces. The thickness of the first metal layer 30 is preferably in a range of 0.1 µm to 10 µm. The first metal layer 30 being thinner than 0.1 µm may let light to transmit through the first metal layer 30. The first metal layer 30 being thicker than 10 µm may lead to an increase in manufacturing costs.

The first metal layer 30 shown in FIG. 2 is in contact with the lateral surfaces 20C of the light-transmissive member 20. Thus, the first metal layer 30 can reflect light reaching the first metal layer 30, so that light exits from the light exiting surface 20B of the light-transmissive member 20 to the outside. The first metal layer 30 may be made of metal exhibiting high reflectivity, such as aluminum, silver, gold, and titanium. The reflectivity of the first metal layer 30 with respect to the peak wavelength of the light emitting element 10 is preferably 80% or greater, and more preferably 90% or greater. The first metal layer 30 can be formed by, for example, sputtering or the like.

The first metal layer 30 can further alleviate leakage of light from the lateral surfaces 20C of the light-transmissive member 20 by covering the entire lateral surfaces 20C of the light-transmissive member 20. The first metal layer 30 may be formed on the lateral surfaces 20C of the light-transmissive member 20, however, it is preferably formed on the surface of the first protective member 60 as described in the following.

First Protective Member 60

The light emitting device 100 shown in FIG. 2 includes the first protective member 60. The first protective member 60 includes a first surface 61, a second surface 62 opposite to the first surface 61, and the through hole 63 penetrating through the first surface 61 and the second surface 62. The inner surface of the through hole 63 is covered with the first metal layer 30. The light-transmissive member 20 is disposed inside the through hole 63. The first protective member 60 shown in FIG. 2 is disposed so that the first surface 61 is disposed on the light exiting surface 20B side and the second surface 62 is disposed on the light entering surface 20A side. Provision of the first protective member 60 can less likely for the first metal layer 30 to be damaged and thereby removed. This can alleviate leakage of light from the lateral surfaces 20C of the light-transmissive member 20 for a long period. The width of the first protective member 60 is preferably in a range of 1 µm to 10 µm. The width of the first protective member 60 is a length of the first protective member 60 in the direction perpendicular to the lateral surfaces 10C of the light emitting element 10.

The first metal layer 30 reflects light and alleviate leakage of light from lateral surfaces of the light emitting device 100, therefore, the first protective member 60 may be made of a material having low light reflectivity. Therefore, the first protective member 60 is suitably made of resin being cost-effective and exhibiting good heat resistance. The material of the first protective member 60 may be resin, an inorganic material, glass or a composite body of the foregoing substances. The resin material of the first protective member 60 may be thermosetting resin such as silicone resin, silicone modified resin, epoxy resin, and phenolic resin, or thermoplastic resin such as polycarbonate resin, acrylic resin, methylpentene resin, and polynorbornene resin. In particular, silicone resin is suitable due to its good heat resistance. The inorganic material of the first protective member 60 may be a single-layer film or a multi-layer film of aluminum oxide, aluminum nitride, zirconium oxide, zirconium nitride, titanium oxide, titanium nitride, zinc oxide, a ceramic being a mixture of the foregoing substances, low temperature co-fired ceramic or the like. A composite body being a mixture of the inorganic material and the resin material described above may be used.

The first protective member 60 may be formed to be plate-like, and thereafter provided with the through hole 63 that penetrates through the first surface 61 and the second surface 62 being the surfaces opposite to each other. Alternatively, the first protective member 60 may be a plate member previously provided with the through hole 63. By forming a metal layer on the inner surface of the through hole 63, the first metal layer 30 is formed on the lateral surfaces of the light-transmissive member 20.

In the light emitting device shown in FIG. 1, the outer shape of the light emitting element 10 and the outer shape of the first protective member 60 as seen in a plan view are substantially similar, and are quadrangular. Further, the outer shape of the through hole 63 formed substantially at the center of the first protective member 60 as seen in a plan view is substantially similar to the outer shape of the light emitting element 10, and is quadrangular. The shape of the light emitting device as seen in a plan view may be circular, elliptical or other such shape which include a curve, or may be polygonal such as triangular, pentagonal, and hexagonal as well as quadrangular. The shape of the first protective member 60 as seen in a plan view may be circular, elliptical or other such shape which include a curve, or may be polygonal such as triangular, pentagonal, and hexagonal as well as quadrangular.

In the first protective member 60, the through hole 63 has a shape larger quadrangular than the outer shape of the light extracting surface 10A of the light emitting element 10. A dimension of the quadrangular through hole 63 opened at the first protective member 60 may be, for example, in a range of 200 µm to 300 µm per side. The shape of the through hole may be circular, elliptical or other such shape which include a curve, or may be polygonal such as triangular, quadrangular, pentagonal, and hexagonal.

The first metal layer 30 formed on the inner surface of the through hole 63 shown in FIG. 2 includes a cover 31 that covers the first surface 61. The cover 31 is a part of the first metal layer 30 that extends from the edge of the through hole 63 over the first surface 61 and have a L-shape as seen in a cross-sectional view. In this manner, on the light exiting surface 20B side, the region outer than an outer periphery of the light-transmissive member 20 is covered with the cover 31 of the first metal layer 30. This clearly defines the boundary between the light-transmissive member 20 and the cover 31 and improves distinguishability.

Insulating Member 40

The insulating member 40 alleviates the light emitting element 10 from short-circuiting. The insulating member 40 is disposed so as to cover the lateral surfaces 10C and the electrode formed surface 10B of the light emitting element 10 and expose at least part of the pair of electrodes 13, 14. As shown in FIG. 2, the insulating member 40 may cover part of the light entering surface 20A and the joining member 25. The insulating member 40 is formed so as to expose the outer periphery of the light entering surface 20A, an end of the first metal layer 30, and the second surface 62 of the first protective member 60, on the light entering surface 20A side. The second metal layer 50 which will be described later is formed at the portion exposed outside the insulating member 40.

The material of the insulating member 40 may at least be electrically insulating and may be specified as appropriate. The material may be thermosetting resin such as silicone resin, silicone modified resin, epoxy resin, and phenolic resin, or may be thermoplastic resin such as polycarbonate resin, acrylic resin, methylpentene resin, and polynorbornene resin. Further, the insulating member 40 may be made of an inorganic substance exhibiting good light resistance, such as glass, silica gel or the like. The light emitting element 10 may become high temperature, therefore, the insulating member 40 being in close proximity to the light emitting element 10 is preferably made of resin that exhibits good heat resistance. Silicone resin is particularly preferable for the insulating member 40 due to its highly heat resistant, electrically insulating, and resistant to deterioration from aging.

The insulating member 40 may contain a light reflecting member in the base material. Preferably, the material of the light reflecting member is, for example, titanium oxide, silicon oxide, zirconium oxide, potassium titanate, aluminum oxide, aluminum nitride, boron nitride, mullite or the like. By containing the light reflecting member, the insulating member 40 is capable of reflecting light exiting from the lateral surfaces 100 of the light emitting element 10 to be extracted from the light extracting surface 10A. In the light emitting device 100, the lateral surfaces 10C of the light emitting element 10 are covered with the second metal layer 50 which will be described later, therefore, the insulating member 40 is not required to be light reflective, and the light reflecting member may not be contained in the base material.

The insulating member 40 is formed by, for example, applying a resin material by spraying or the like. A thickness of the insulating member 40 can be appropriately set, and it is preferably 1 µm to 10 µm, and further preferably 2 µm to 5 µm. The insulating member 40 having thickness greater than 1 µm facilitates alleviation of the light emitting element 10 to be short-circuited. The insulating member 40 being thinner than 10 µm facilitates downsizing of the light emitting device 100.

Second Metal Layer 50

The second metal layer 50 covers the lateral surfaces 10C of the light emitting element 10 interposing the insulating member 40. Provision of the second metal layer 50 alleviates leakage of light from the insulating member 40. The second metal layer 50 shown in FIG. 2 is in contact with the insulating member 40. Thus, the second metal layer 50 can reflect light transmitting through the insulating member 40 and reaching the second metal layer 50, so that the light can be extracted from the light entering surface 20A. The second metal layer 50 can alleviate leakage of light from the lateral surfaces of the light emitting device while being thinner than a layer made of resin mixed with titanium oxide or ceramic. This provides the downsized light emitting device capable of alleviating leakage of light from its lateral surfaces. A thickness of the second metal layer 50 is preferably in a range of 0.1 µm to 10 µm. The second metal layer 50 being thinner than 0.1 µm may let light to transmit through the second metal layer 50. The second metal layer 50 being thicker than 10 µm may lead an increase in manufacturing costs.

The second metal layer 50 shown in FIG. 2 covers the outer periphery of the light entering surface 20A, the end of the first metal layer 30, and the second surface 62 of the first protective member 60, on the light entering surface 20A side. Thus, the end of the first metal layer 30 and the second metal layer 50 can be in contact with each other, thereby alleviating leakage of light from a gap which would otherwise exist between the first metal layer 30 and the second metal layer 50.

Similarly to the first metal layer 30 described above, the second metal layer 50 may be made of metal exhibiting high reflectivity, such as aluminum, silver, gold, and titanium. The reflectivity of the second metal layer 50 to the peak wavelength of the light emitting element 10 is preferably 80% or greater, and more preferably 90% or greater. The second metal layer 50 can be formed by, for example, sputtering or vapor deposition of a metal material. The second metal layer 50 is not necessarily made of the metal identical to the first metal layer 30, and may be made of metal different from the first metal layer 30.

Second Protective Member 70

The second protective member 70 covers the lateral surfaces 10C of the light emitting element 10 interposing the second metal layer 50, and exposes at least part of the each of electrodes 13, 14 of the light emitting element 10. Thus, the second protective member 70 can protect the second metal layer 50 formed on the outer side of the insulating member 40. Provision of the second protective member 70 effectively alleviates the second metal layer 50 to be damaged and removed. This alleviates leakage of light from the lateral surfaces of the light emitting device for a long period.

The second metal layer 50 reflects light and alleviates leakage of light from the lateral surfaces of the light emitting device, therefore, the second protective member 70 may be made of a material having low light reflectivity. Therefore, the second protective member 70 is suitably made of resin being cost-effective and exhibiting good heat resistance. The material of the second protective member 70 may be resin, an inorganic material, glass or a composite body of the foregoing substances, similarly to the first protective member 60 described above. The resin material of the second protective member 70 may be, particularly, thermosetting resin such as silicone resin, silicone modified resin, epoxy resin, and phenolic resin, or thermoplastic resin such as polycarbonate resin, acrylic resin, methylpentene resin, and polynorbornene resin. In particular, silicone resin is suitable due to its good light resistance and heat resistance. The inorganic material of the second protective member 70 may be a single-layer film or a multi-layer film of aluminum oxide, aluminum nitride, zirconium oxide, zirconium nitride, titanium oxide, titanium nitride, zinc oxide, a ceramic being a mixture of the foregoing substances, low temperature co-fired ceramic or the like. A composite body being a mixture of the inorganic material and the resin material described above may be used.

The second protective member 70 may be formed on the surface of the second metal layer 50 by, for example, compression molding, transfer molding, injection molding or the like. In the case where the second protective member 70 contains resin, the second protective member 70 may be formed on the surface of the second metal layer 50 by applying. The second protective member 70 shown in FIG. 2 is formed to the height where the second protective member 70 reaches the plane substantially flush with the exposed surface of the pair of electrodes 13, 14 formed at the electrode formed surface 10B of the light emitting element 10. Accordingly, the thickness of the second protective member 70 is determined by the thickness of the light emitting element 10. In the light emitting device 100, the outer shape of the second protective member 70 and the outer shape of the first protective member 60 are substantially identical to each other as seen in a plan view, and the light emitting device 100 has a shape of a substantial rectangular parallelepiped as a whole.

Second Embodiment

Figure 3:
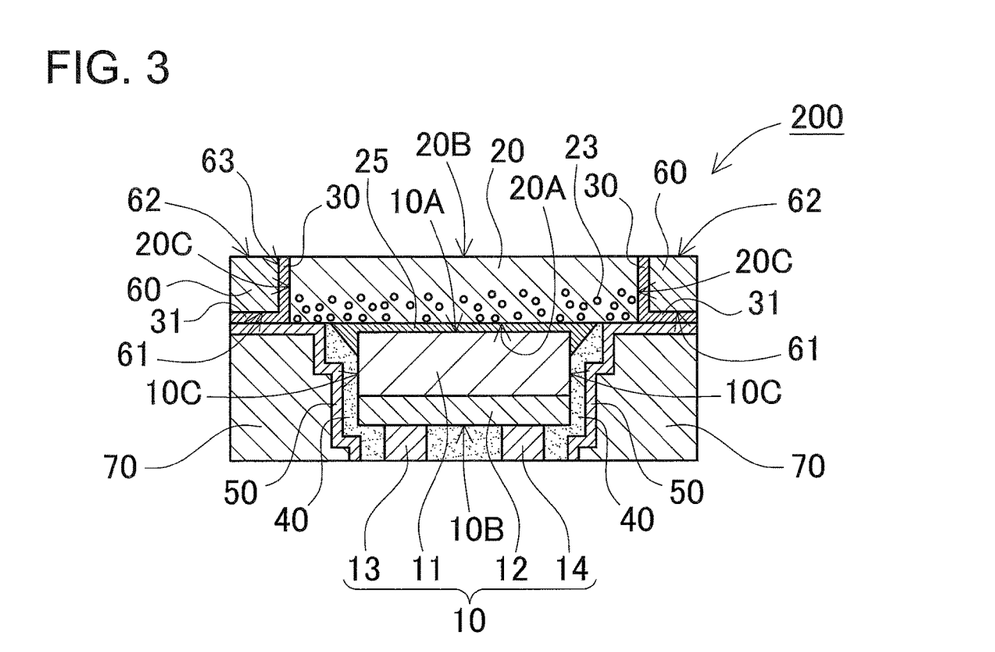
FIG. 3 is a cross-sectional view of a light emitting device according to a second embodiment of the present invention.

FIG. 3 shows a light emitting device according to a second embodiment. A light emitting device 200 shown in FIG. 3 is different from the light emitting device 100 according to the first embodiment shown in FIG. 2 in the structure of the first protective member 60 and the first metal layer 30. In the first protective member 60 shown in FIG. 3, the second surface 62 is positioned at the light exiting surface 20B side, and the first surface 61 is positioned at the light entering surface 20A side. The first metal layer 30 formed on the inner surface of the through hole 63 includes the cover 31 that covers the first surface 61 positioned at the light emitting element 10 side. As shown in FIG. 3, the cover 31 is a part of the first metal layer 30 that extends from the edge of the through hole 63 over the first surface 61 and have a L-shape as seen in a cross-sectional view.

The second metal layer 50 covers the outer periphery of the light entering surface 20A and the cover 31. The cover 31 and the second metal layer 50 being in contact with each other alleviates leakage of light in the lateral surface direction of the light emitting device from a gap which would otherwise exist between the first metal layer 30 and the second metal layer 50.

Third Embodiment

Figure 4:
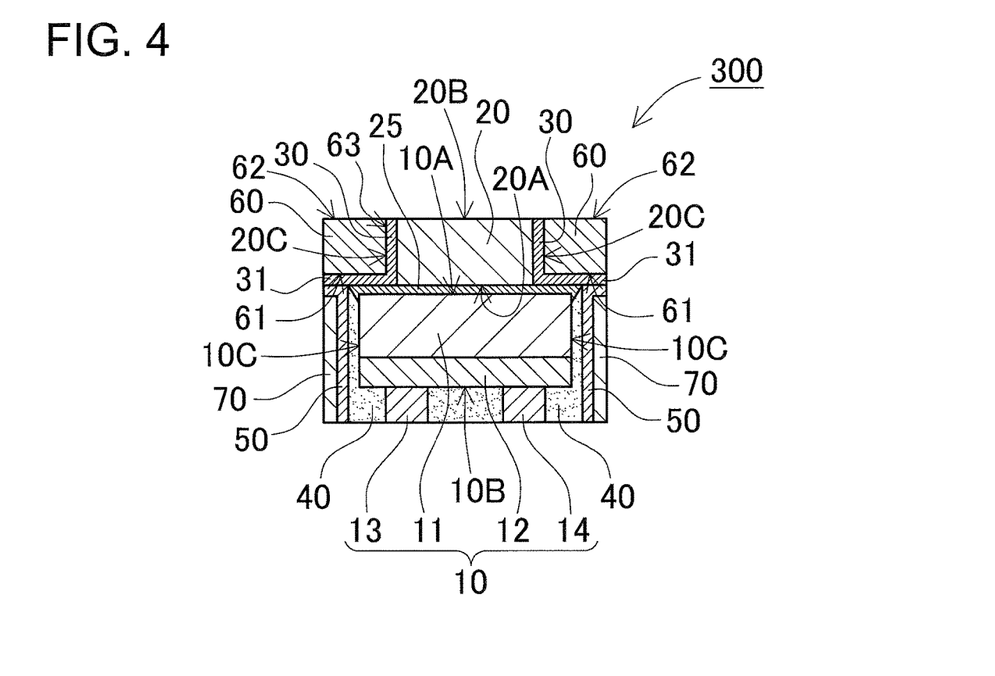
FIG. 4 is a cross-sectional view of a light emitting device according to a third embodiment of the present invention.

FIG. 4 shows a light emitting device according to a third embodiment. In a light emitting device 300 shown in FIG. 4, the light-transmissive member 20 is smaller than the light emitting element 10 in area as seen in a plan view. This allows the light emitting device to approximate a point light source.

Further, in the light emitting device 300, the second surface 62 of the first protective member 60 is disposed on the light exiting surface 20B side, and the first surface 61 is disposed on the light entering surface 20A side, similarly to the light emitting device 200 shown in FIG. 3. The first metal layer 30 includes the cover 31 that covers the first surface 61. In FIG. 4, with the cover 31 covering the first surface 61 of the first protective member 60, which is positioned at the light emitting element 10 side, light exiting from the light emitting element 10 is alleviated from leaking into the first protective member 60.

Fourth Embodiment

Figure 5:
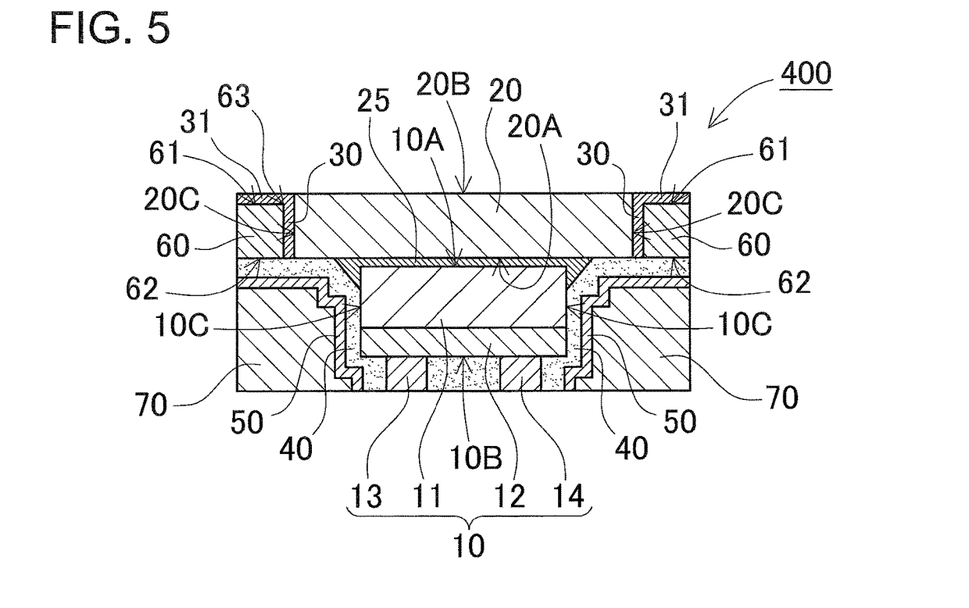
FIG. 5 is a cross-sectional view of a light emitting device according to a fourth embodiment of the present invention.

FIG. 5 shows a light emitting device according to a fourth embodiment. A light emitting device 400 shown in FIG. 5 is different from the light emitting device 100 shown in FIG. 2 in the structure of the insulating member 40 covering the light emitting element 10. In the light emitting device 400 shown in FIG. 5, the insulating member 40 covers an outer periphery of the light entering surface 20A, the end of the first metal layer 30, and a second surface 62 of the first protective member 60, on the light entering surface 20A side.

While details will be described later, such structure allows the insulating member 40 to be formed simply and easily, without the necessity of masking the outer periphery of the light-transmissive member 20 and the first protective member 60 in forming the insulating member 40. With the lateral surfaces of the light-transmissive member 20 being covered with the first metal layer 30 and with the lateral surfaces 10C of the light emitting element 10 being covered with the second metal layer 50, leakage of light from the lateral surfaces of the light emitting device can be alleviated. In the light emitting device 400, the insulating member 40 is light-reflective. With the insulating member 40 having light-reflectivity, leakage of light from between the first metal layer 30 and the second metal layer 50 can be alleviated.

Fifth Embodiment

Figure 6:
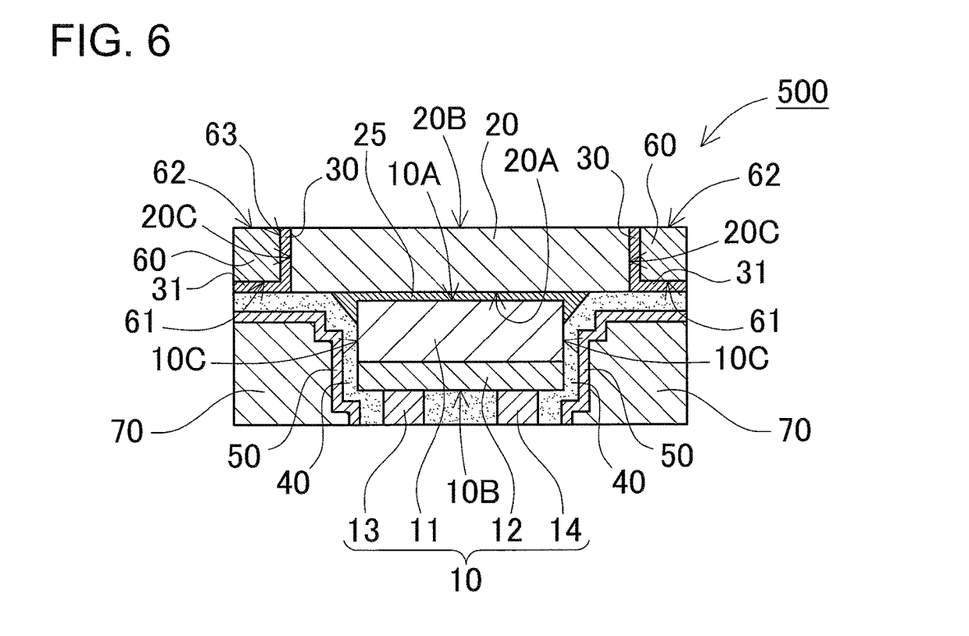
FIG. 6 is a cross-sectional view of a light emitting device according to a fifth embodiment of the present invention.

FIG. 6 shows a light emitting device according to a fifth embodiment. A light emitting device 500 shown in FIG. 6 is different from the light emitting device 200 shown in FIG. 3 in the structure of the insulating member 40 covering the light emitting element 10. In the light emitting device 500 shown in FIG. 6, the insulating member 40 covers the outer periphery of the light entering surface 20A and the cover 31 of the first metal layer 30, on the light entering surface 20A side.

While details will be described later, such a structure allows the insulating member 40 to be formed simply and easily, without the necessity of masking the outer periphery of the light-transmissive member 20 and the first protective member 60 in forming the insulating member 40. With the lateral surfaces of the light-transmissive member 20 being covered with the first metal layer 30 and with the lateral surfaces 10C of the light emitting element 10 being covered with the second metal layer 50, leakage of light from the lateral surfaces of the light emitting device can be alleviated. In the light emitting device 500, the insulating member 40 is light-reflective. With the insulating member 40 having light-reflective, leakage of light from between the first metal layer 30 and the second metal layer 50 can be alleviated.

Sixth Embodiment

Figure 7:
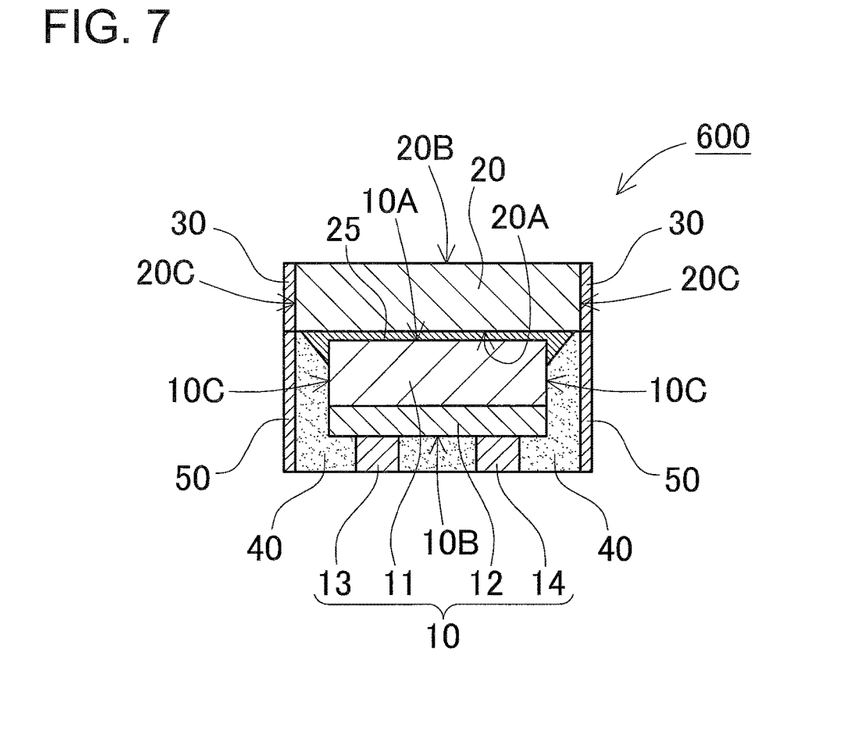
FIG. 7 is a cross-sectional view of a light emitting device according to a sixth embodiment of the present invention.

FIG. 7 shows a light emitting device according to a sixth embodiment. A light emitting device 600 shown in FIG. 7 does not include the first protective member and the second protective member, and has the first metal layer 30 and the second metal layer 50 disposed on the lateral surfaces of the light emitting device 600. In the light emitting device 600, the first metal layer 30 covering the lateral surfaces of the light-transmissive member 20 and the second metal layer 50 covering the lateral surfaces of the light emitting element 10 interposing the insulating member 40 have substantially the identical outer shape as seen in a plan view. The first metal layer 30 and the second metal layer 50 being in contact with each other alleviates leakage of light from any gap which would otherwise exist between the first metal layer 30 and the second metal layer 50. The absence of the first protective member and the second protective member achieves downsizing of the light emitting device 600.

In the light emitting device 600 shown in FIG. 7, while the first protective member and the second protective member are not provided on the outer side of the first metal layer 30 and the second metal layer 50, the first protective member and/or the second protective member may be temporarily formed during manufacture. Removing the first protective member and/or the second protective member during or at the final stage in manufacturing the light emitting device provides the light emitting device of the structure shown in FIG. 7.

Method of Manufacturing Light Emitting Device

Subsequently, a description will be given of a method of manufacturing the light emitting device. FIGS. 8A to 9G show process of manufacturing the light emitting device 100 according to the first embodiment shown in FIG. 1.

Method of Manufacturing Light Emitting Device According to First Embodiment (1) Provision of Covering Member In providing the covering member, a covering member 65 is provided, which covering member 65 includes: the light-transmissive member 20 including the light entering surface 20A, the light exiting surface 20B opposite to the light entering surface, and the lateral surfaces 20C provided between the light entering surface and the light exiting surface; and the first metal layer 30 covering the lateral surfaces 20C of the light-transmissive member. The providing the covering member includes: providing the first protective member 60 including the first surface 61, the second surface 62 opposite to the first surface 61, and the through hole 63 penetrating through the first surface 61 and the second surface 62; forming the first metal layer 30 on the inner surface of the through hole 63 of the first protective member 60; and forming the light-transmissive member 20 on the inner side of the first metal layer 30.

a: Providing First Protective Member

Figure 8A:
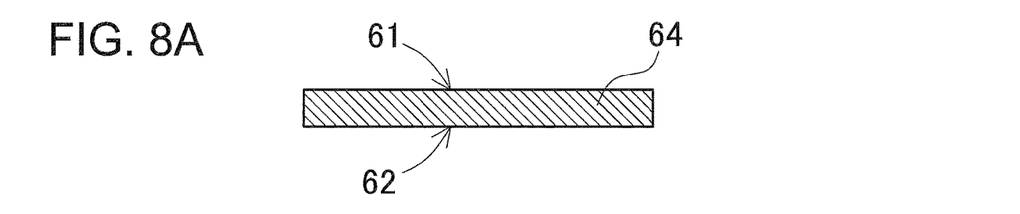
FIGS. 8A to 8F are cross-sectional views showing operations in manufacturing the light emitting device according to the first embodiment shown in FIG. 1.

In providing the first protective member, the first protective member 60 including the through hole 63 penetrating through the first surface 61 and the second surface 62 opposite to each other is provided. The first protective member 60 is formed by, for example, opening the through hole 63 in a flat-shaped plate member 64. As shown in FIG. 8A, the plate member 64 that forms the first protective member 60 has a shape of a plate of a predetermined thickness, and made of thermosetting resin, thermoplastic resin, an inorganic material, glass or a composite body of the foregoing substances.

Figure 8B:
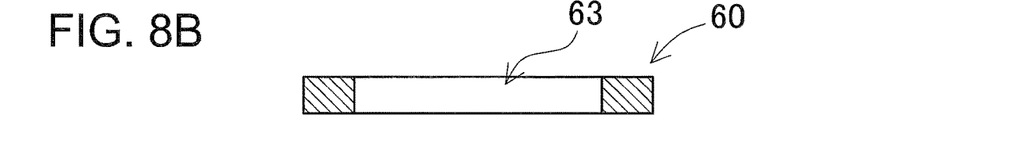

As shown in FIG. 8B, in the flat-shaped plate member 64, the through hole 63 penetrating through the first surface 61 and the second surface 62 opposite to each other is opened. The through hole 63 is opened in a predetermined size through punching, etching or the like. The first protective member 60 may be formed with the through hole 63 by laser irradiation, etching, blasting or the like. When the first protective member 60 contains resin, the through hole 63 may be formed by punching. The first protective member 60 may be formed using a plate member previously provided with the through hole.

b: Forming First Metal Layer

Figure 8C:
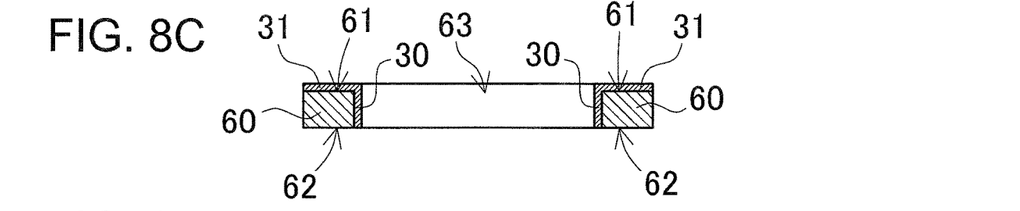

As shown in FIG. 8C, in forming the first metal layer, the first metal layer 30 is formed ion the inner surface of the through hole 63 opened in the plate-like first protective member 60. The first metal layer 30 can be formed by a known method such as sputtering, vapor deposition or the like. For example, the first metal layer 30 can be formed by sputtering aluminum. Further, the first metal layer 30 is formed on the inner surface of the through hole 63 and over the first surface 61 of the first protective member 60. The first metal layer 30 that covers the first surface 61 is the cover 31.

In the foregoing manner, the first metal layer 30 is formed on the inner surface of the through hole 63 at the first protective member 60. The forming the first metal layer may include cleaning and/or polishing the surface of the first metal layer 30. This improves reflectivity of the first metal layer 30, and consequently improves the light extraction efficiency of the light emitting device.

c: Forming Light-Transmissive Member

Figure 8D:
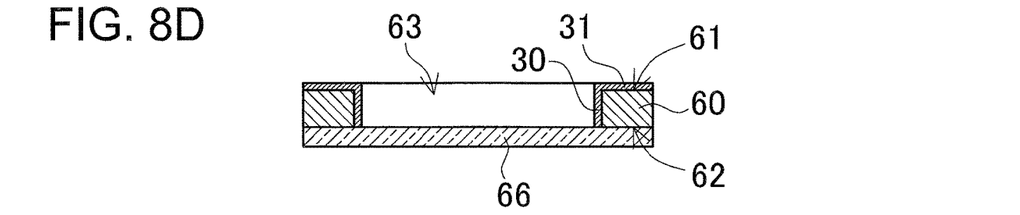
Figure 8E:
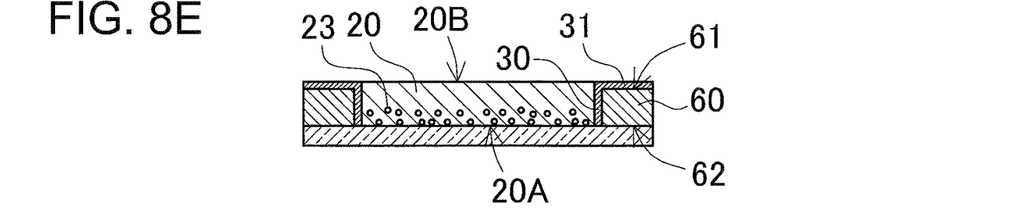

As shown in FIG. 8D, a heat-resistant sheet 66 is adhered to the second surface 62 of the first protective member 60 provided with the first metal layer 30, to close the through hole 63. As shown in FIG. 8E, in the through hole 63 closed by the heat-resistant sheet 66 a material that forms the light-transmissive member 20 is supplied. In the first protective member 60 shown in FIG. 8D, the heat-resistant sheet 66 is adhered to the second surface 62 which is not covered with the cover 31.

When the material forming the light-transmissive member 20 contains a fluorescent material or the like being the wavelength conversion member 23, the wavelength conversion member 23 may be unevenly positioned in the light-transmissive member 20 by natural sedimentation or forced sedimentation. In forming the light-transmissive member 20, for example, the wavelength conversion member 23 may be positioned in high density at the light entering surface 20A side, while a surface of the light-transmissive member 20 on which the heat-resistant sheet 66 is adhered serves as the light entering surface 20A, as shown in FIG. 3, in the case of the light-transmissive member 20 in which a surface adhered to the cover 31 is the light entering surface 20A side, adhering the heat-resistant sheet 66 to a surface adhered to the cover 31 allows the wavelength conversion member 23 to be positioned in highly density at the light entering surface 20A side in forming the light-transmissive member 20. With the light-transmissive member in which the contained materials are not unevenly positioned or the light-transmissive member in which the contained materials are positioned in high density on the light exiting surface 20B side, a surface on which the heat-resistant sheet is adhered may serve as the light exiting surface.

As shown in FIG. 8E, in the region inside the first metal layer 30 formed on the inner surface of the through hole 63 a material such as light-transmissive resin or glass is supplied to form the light-transmissive member 20. When the light-transmissive member 20 is formed in the region inner than the first protective member 60, the heat-resistant sheet 66 is removed. Thus, the covering member 65 including the light-transmissive member 20 is obtained. The covering member 65 has the light exiting surface 20B and the light entering surface 20A of the light-transmissive member 20 exposed at the opposite surfaces of the first protective member 60, respectively, and has the lateral surfaces 20C of the light-transmissive member 20 covered with the first metal layer 30.

Figure 8F:
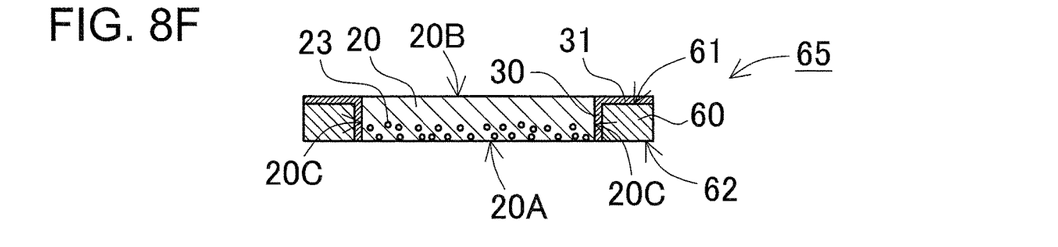
Figure 9A:
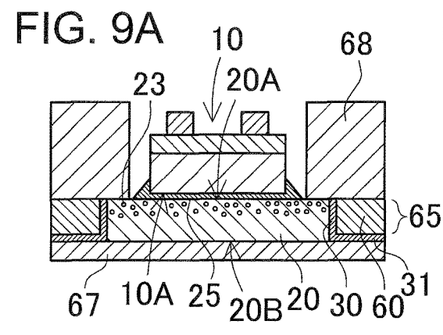
FIGS. 9A to 9G are cross-sectional views showing operations in manufacturing the light emitting device according to the first embodiment shown in FIG. 1.

As shown in FIG. 9A, the covering member 65 manufactured by a process shown in FIG. 8F is disposed at the upper surface of a supporter 67 which is substantially planar. The covering member 65 is disposed such that the light exiting surface 20B of the light-transmissive member 20 facing an upper surface of the supporter 67.

(2) Masking

As shown in FIG. 9A, the region outer than the lateral surfaces 10C of the light emitting element is masked with a masking member 68. As shown in FIG. 9A, by masking the region outer than the lateral surfaces 10C of the light emitting element with the masking member 68, the region where the joining member 25 and the insulating member 40 are to be disposed can be defined. The masking member 68 may have a structure having: a partition the light emitting element 10; and a through hole exposing the light entering surface 20A of the light-transmissive member 20. An exemplary structure thereof is a tubular body. Alternatively, the masking member 68 may have a structure with which a plurality of light emitting devices can be manufactured simultaneously. That is, in the case where a covering member having a plurality of light-transmissive members is to be masked, a combined body of a plurality of tubular bodies, a block body having a plurality of through holes, or any structure similar to the foregoing may be employed.

The masking is performed prior to at least forming the insulating member which will be described later. Further, performing the masking prior to joining which will be described later is preferable, because the masking can define the region in which the joining member 25 is to be disposed. However, in the joining, the joining member can be alleviated from spreading by adjusting the viscosity of the joining member. Therefore, the masking may be performed after the joining.

(3) Joining

In joining, as shown in FIG. 9A, the light entering surface 20A of the light-transmissive member 20 and the light extracting surface 10A of the light emitting element 10 are joined to each other. The light emitting element 10 is fixed to the light entering surface 20A of the light-transmissive member 20 interposing the joining member 25.

(4) Forming Insulating Member

Figure 9B:
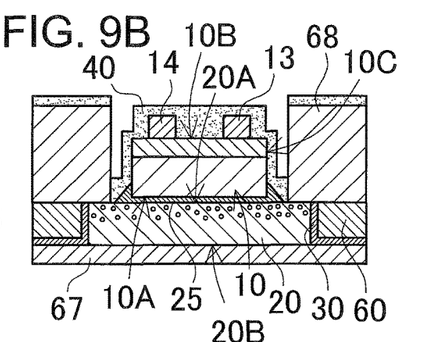

In forming the insulating member, as shown in FIG. 9B, the lateral surfaces 10C and the electrode formed surface 10B of the light emitting element are covered with the insulating member 40. When the insulating member 40 is made of resin, the insulating member 40 may be formed by a known method such as spraying. When the insulating member 40 is made of an inorganic substance, the insulating member 40 may be formed by a known method such as vapor deposition. In FIG. 9B, since the region outer than the outer periphery of the light-transmissive member 20 is masked with the masking member 68, the insulating member 40 covers the lateral surfaces 10C of the light emitting element 10, the joining member 25, and part of the light entering surface 20A of the light-transmissive member 20 which are exposed outside the masking member 68. Further, in the electrode formed surface 10B, the insulating member 40 in which the pair of electrodes 13, 14 is embedded is formed. After the insulating member 40 is formed, the masking member 68 is removed. Provision of the masking member 68 alleviates to form the insulating member 40 on the surface of the first protective member 60. Thus, in forming the second metal layer which will be described later, contact between the first metal layer and the second metal layer is facilitated.

(5) Forming Second Metal Layer

Figure 9C:
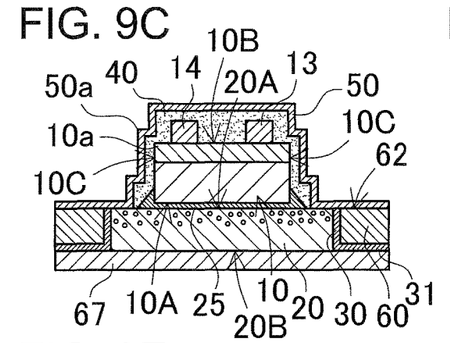

In forming the second metal layer, as shown in FIG. 9C, the second metal layer 50 is formed at the surface of the insulating member 40. The second metal layer 50 shown in FIG. 9C covers the outer periphery of the light entering surface 20A, the end of the first metal layer 30, and the second surface 62 of the first protective member 60, on the light entering surface 20A side. The second metal layer 50 may be formed by a known method such as sputtering or vapor deposition. For example, the second metal layer 50 may be formed by sputtering aluminum. The second metal layer 50 is formed to have a bent part 50a that is bent so as to conform to the shape of a corner 10a being the boundary between the lateral surfaces 10C and the electrode formed surface 10B of the light emitting element 10. Thus, the second metal layer 50 covers the corner 10a of the light emitting element 10 interposing the insulating member 40. Further, the second metal layer 50 is in contact with the end of the first metal layer 30.

(6) Forming Second Protective Member

Figure 9D:
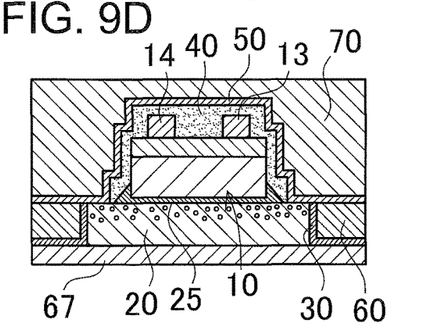

In forming the second protective member, as shown in FIG. 9D, the second protective member 70 that covers the surface of the second metal layer 50 is formed. The second protective member 70 is formed over the surface of the second metal layer 50 by, for example, compression molding, transfer molding, injection molding. In the case where the second protective member 70 contains resin, the second protective member 70 may be formed by spraying. As shown in FIG. 9D, the second protective member 70 is formed over the entire light emitting element 10 side of the covering member 65, so as to be thick enough to embed the second metal layer 50 covering the insulating member 40.

(7) Removing

Figure 9E:
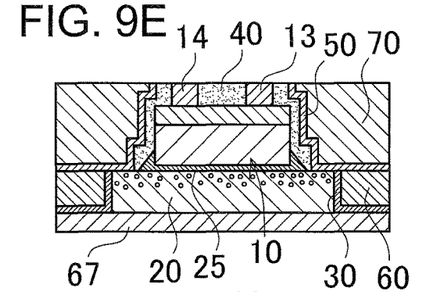

In removing, after the second protective member 70 is cured, as shown in FIG. 9E, the insulating member 40 covering the electrode formed surface 10B, the second metal layer 50, and the second protective member 70 are partially removed, thereby the pair of electrodes 13, 14 is exposed.

(8) Cutting

Figure 9F:
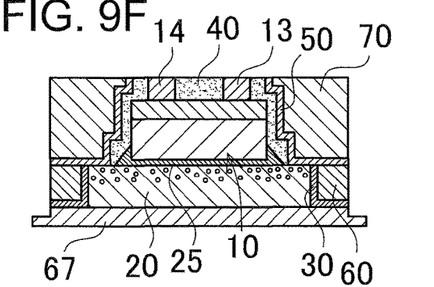
Figure 9G:
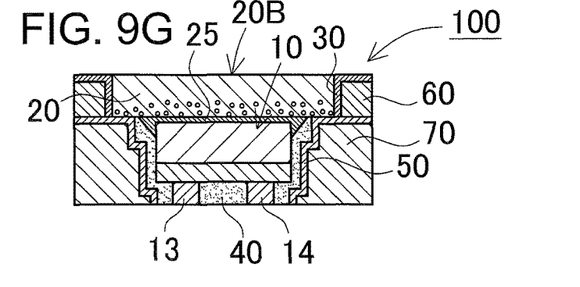

Following the removing, as shown in FIG. 9F, the first protective member 60 and the second protective member 70 are cut with a dicing blade or the like, so that the first metal layer 30 keeps covering the lateral surfaces of the light-transmissive member 20 and the second metal layer 50 keeps covering the lateral surfaces 10C of the light emitting element. The cutting in this manner reduces the thickness of the lateral surface of the light emitting device while alleviating leakage of light from the lateral surfaces, and thus achieves downsizing of the light emitting device. After the desired outer shape is obtained by the cutting, as shown in FIG. 9G, the supporter 67 is removed and the light emitting device 100 is obtained.

In an actual manufacture, a plurality of light emitting devices may be manufactured simultaneously. In this case, in the providing the covering member, the covering member in which a plurality of light-transmissive members are arranged in a matrix is provided. The surface of the covering member is masked with the masking member and each of the light emitting elements is fixed to each of the light-transmissive members. The insulating member, the second metal layer, and the second protective member are formed on the surface of each of the light emitting elements. Thereafter, in the removing, the insulating member covering the electrode formed surface, the second metal layer, and the second protective member are removed. In the cutting, the first protective member and the second protective member are cut in each of the light-transmissive members or light emitting elements arranged in a matrix. Thus, a plurality of light emitting devices is manufactured.

Method of Manufacturing Light Emitting Device According to Second Embodiment

In manufacturing the light emitting device 200 according to the second embodiment shown in FIG. 3, in the forming the light-transmissive member, the heat-resistant sheet 66 is adhered to the first surface 61, which is covered with the cover 31 of the first metal layer 30, to form the light-transmissive member 20. In formation of the light-transmissive member 20, a surface of the light-transmissive member 20 on which the heat-resistant sheet 66 is adhered, serves as the light entering surface 20A, the wavelength conversion member 23 can be positioned in high density at the light entering surface 20A side. Thus, the first protective member 60 in which the cover 31 is disposed on the light entering surface 20A side is manufactured.

Thereafter, similarly to the processes described with reference to FIGS. 9A to 9G, the light emitting device 200 is manufactured. In the bonding, the light emitting element 10 is adhered to the light entering surface 20A of the light-transmissive member 20. In the masking, the region outer than the lateral surfaces 10C of the light emitting element is masked with the masking member 68. Thereafter, in the forming the insulating member, the insulating member 40 covering the lateral surfaces 10C and the electrode formed surface 10B of the light emitting element 10 is formed. In the forming the second metal layer, the second metal layer 50 is formed on the surface of the insulating member 40 and the cover 31. With the second metal layer 50 covering also the cover 31, which is disposed on the light emitting element 10 side of the first protective member 60, the first metal layer 30 and the second metal layer 50 are brought into contact with each other. In the forming the second protective member, the second protective member 70 covering the surface of the second metal layer 50 is formed. Thereafter, through the removing and the cutting, the light emitting device 200 shown in FIG. 3 is manufactured.

Method of Manufacturing Light Emitting Device According to Third Embodiment (1) Providing Covering Member The light emitting device 300 according to the third embodiment shown in FIG. 4 is manufactured as follows.

a: Providing First Protective Member

In providing the first protective member, the through hole 63 opened on the plate-like first protective member 60 is smaller in size than the light extracting surface 10A of the light emitting element 10.

b: Forming First Metal Layer

The first metal layer 30 is formed on the inner surface of the through hole 63 opened at the first protective member 60. The first metal layer 30 is formed on the inner surface of the through hole 63 and over the first surface 61 of the first protective member 60, to form the cover 31 that covers the first surface 61.

c: Forming Light-Transmissive Member

The heat-resistant sheet 66 is adhered to the first surface 61 of the first protective member 60 where the first metal layer 30 is formed, to close the through hole 63. In the through hole 63 closed with the heat-resistant sheet 66, a material that forms the light-transmissive member 20 is supplied. The light emitting device 300 shown in FIG. 4 includes the light emitting element 10 at the first surface 61 side, at which the first surface 61 is covered with the first metal layer 30. Accordingly, in the forming the light-transmissive member, the light-transmissive member 20 is formed in such a manner that the light entering surface 20A is positioned at the first surface 61 side, at which the first surface 61 is covered with the cover 31.

Figure 10A:
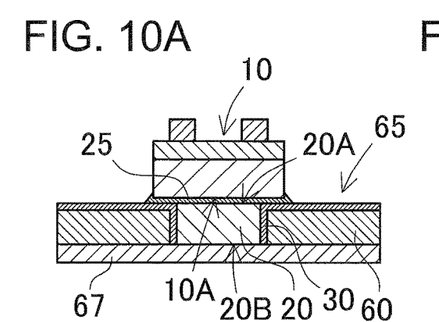
FIGS. 10A to 10H are cross-sectional views showing operations in manufacturing the light emitting device according to the third embodiment shown in FIG. 4.

As shown in FIG. 10A, the covering member 65 manufactured in this manner is disposed at the upper surface of the supporter 67 which is substantially planar. The covering member 65 is disposed so that the light exiting surface 20B of the light-transmissive member 20 opposes to the surface of the supporter 67.

(2) Joining

As shown in FIG. 10A, the light entering surface 20A of the light-transmissive member 20 and the light extracting surface 10A of the light emitting element 10 are joined to each other. The light emitting element 10 is fixed to the light entering surface 20A of the light-transmissive member 20 interposing the joining member 25.

(3) Masking

Figure 10B:
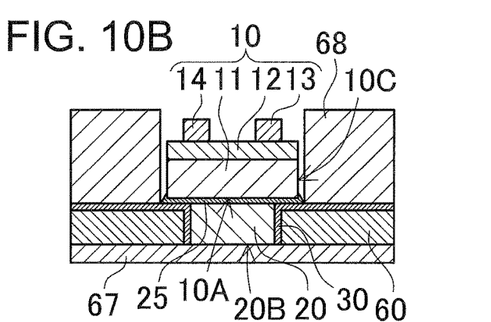

As shown in FIG. 10B, the region outer than the lateral surfaces 10C of the light emitting element is masked with the masking member 68. The masking member 68 shown in the drawing is disposed such that its inner surface is in contact with the joining member 25. The masking may be performed prior to the joining.

(4) Forming Insulating Member

Figure 10C:
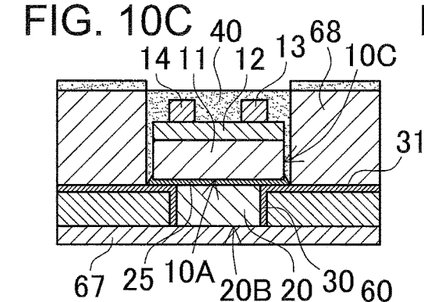

As shown in FIG. 10C, the lateral surfaces 10C and the electrode formed surface 10B of the light emitting element 10 are covered with the insulating member 40. The insulating member 40 is formed in such a manner as to cover the lateral surfaces 10C and the electrode formed surface 10B of the light emitting element 10 and the joining member 25, which are exposed outside the masking member 68 is formed. In the electrode formed surface 10B, the insulating member 40 in which the pair of electrodes 13, 14 are embedded is formed. After the insulating member 40 is formed, the masking member 68 is removed. Provision of the masking member 68 may prevent the insulating member 40 from being formed over the entire cover 31. This facilitates contact between the first metal layer and the second metal layer.

(5) Forming Second Metal Layer

Figure 10D:
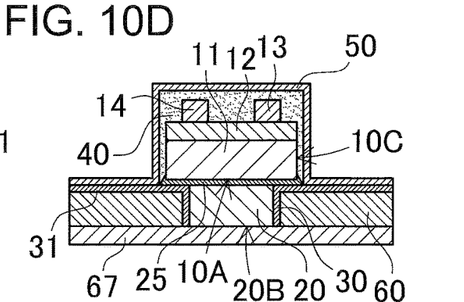

As shown in FIG. 10D, the second metal layer 50 is formed at the surface of the insulating member 40. The second metal layer 50 shown in FIG. 10D covers the entire surface of the insulating member 40 and over the cover 31. Accordingly, the second metal layer 50 and the first metal layer 30 are in contact with each other.

(6) Forming Second Protective Member

Figure 10E:
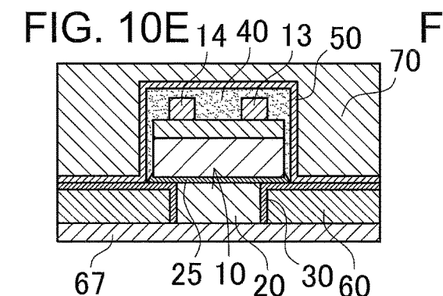

As shown in FIG. 10E, the second protective member 70 that covers the surface of the second metal layer 50 is formed. The second protective member 70 is formed over the entire light emitting element 10 side of the covering member 65, so as to be thick enough to embed the second metal layer 50 covering the insulating member 40.

(7) Removing

Figure 10F:
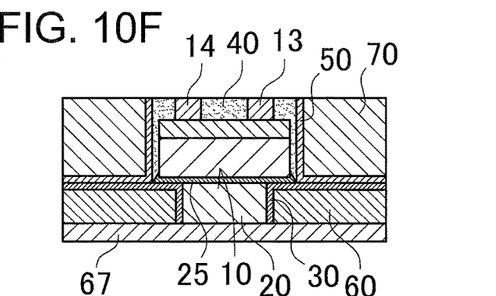

After the second protective member 70 is cured, as shown in FIG. 10F, the insulating member 40 covering the electrode formed surface 10B, the second metal layer 50, and the second protective member 70 are removed, thereby the pair of electrodes 13, 14 provided on the electrode formed surface 10B is exposed.

(8) Cutting

Figure 10G:
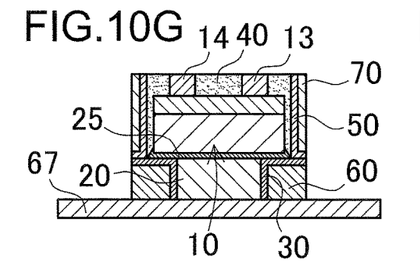
Figure 10H:
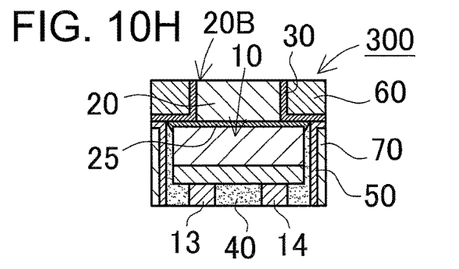

As shown in FIG. 10G, the first protective member 60 and the second protective member 70 are cut with a dicing blade or the like, so that the first metal layer 30 keeps covering the lateral surfaces of the light-transmissive member 20 and the second metal layer 50 keeps covering the lateral surfaces 10C of the light emitting element. This achieves downsizing of the light emitting device 100. After the desired outer shape is obtained by the cutting, as shown in FIG. 10H, the supporter 67 is removed and the light emitting device 300 is obtained.

Method of Manufacturing Light Emitting Devices According to Fourth and Fifth Embodiments The light emitting devices 400, 500 according to the fourth and fifth embodiments shown in FIG. 5 and FIG. 6, respectively, are manufactured through the following processes. Note that, FIGS. 11A to 11G show processes in manufacturing the light emitting device 400 shown in FIG. 5.

(1) Providing Covering Member a: Providing First Protective Member

A plate member in which the through hole 63 is opened is provided as the first protective member 60.

b: Forming First Metal Layer

The first metal layer 30 is formed on the inner surface of the through hole 63 opened at the plate-like first protective member 60. The first metal layer 30 is formed on the inner surface of the through hole 63 and over the first surface 61 of the first protective member 60, to form the cover 31 that covers the first surface 61.

c: Forming Light-Transmissive Member

The heat-resistant sheet 66 is adhered to the second surface 62 of the first protective member 60 where the first metal layer 30 is formed, to close the through hole 63. In the through hole 63 closed with the heat-resistant sheet 66, a material that forms the light-transmissive member 20 is supplied. The light emitting device 400 shown in FIG. 5 includes the light emitting element 10 at the second surface 62 side, at which the second surface 62 is not covered with the first metal layer 30. Accordingly, the forming the light-transmissive member provides the light-transmissive member 20 having the light exiting surface 20B on the first surface 61 side, which first surface 61 is covered with the cover 31. The light emitting device 500 shown in FIG. 6 includes the light emitting element 10 disposed on the first surface 61 side, which first surface 61 is covered with the first metal layer 30. The forming the light-transmissive member provides the light-transmissive member 20 serving as the light entering surface 20A on the first surface 61 side, which first surface 61 is covered with the cover 31.

Figure 11A:
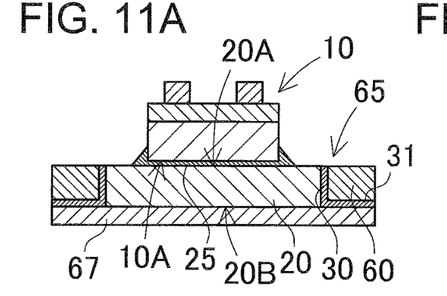
FIGS. 11A to 11G are cross-sectional views showing operations in manufacturing the light emitting device according to the fourth embodiment shown in FIG. 5.

As shown in FIG. 11A, the covering member 65 manufactured in this manner is disposed at the upper surface of the planar supporter 67. The covering member 65 is disposed so that the light exiting surface 20B of the light-transmissive member 20 faces the surface of the supporter 67.

(2) Joining

As shown in FIG. 11A, the light entering surface 20A of the light-transmissive member 20 and the light extracting surface 10A of the light emitting element 10 are joined to each other. The light emitting element 10 is fixed to the light entering surface 20A of the light-transmissive member 20 interposing the joining member 25.

(3) Forming Insulating Member

Figure 11B:
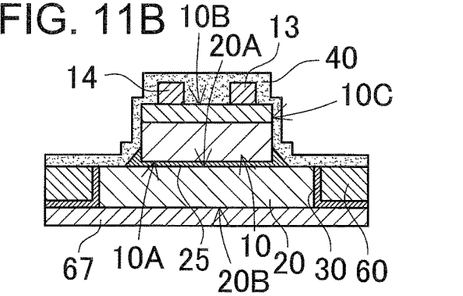

As shown in FIG. 11B, the insulating member 40 is formed to cover the electrode formed surface 10B of the light emitting element 10 where the pair of electrodes 13, 14 is provided, the lateral surfaces 10C of the light emitting element 10, the outer periphery of the light-transmissive member 20, and the first protective member 60. In contrast to the foregoing manufacturing methods, the insulating member 40 is formed without the necessity of masking particular regions of the light-transmissive member 20 and the first protective member 60. Thus, the insulating member 40 can be formed simply and in a short time with the reduced processes in manufacture.

(4) Forming Second Metal Layer

Figure 11C:
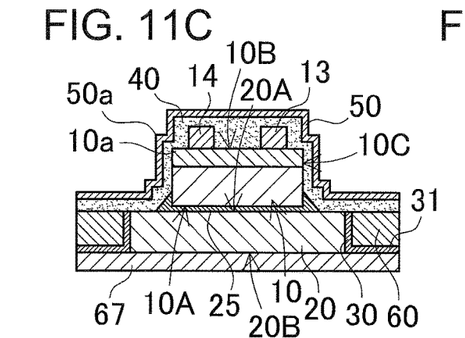

As shown in FIG. 11C, the second metal layer 50 is formed over the entire surface of the insulating member 40.

(5) Forming Second Protective Member

Figure 11D:
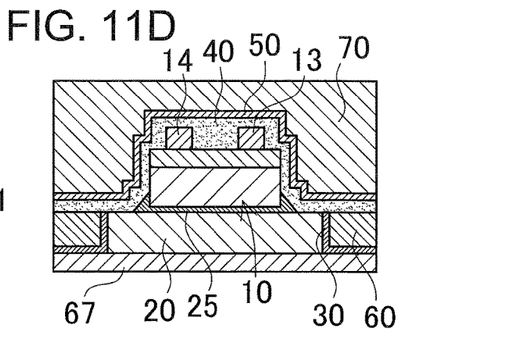

As shown in FIG. 11D, the second protective member 70 that covers the second metal layer 50 is formed. The second protective member 70 is formed over the entire light emitting element 10 side of the covering member 65, so as to be thick enough to embed the second metal layer 50 covering the insulating member 40.

(6) Removing

Figure 11E:
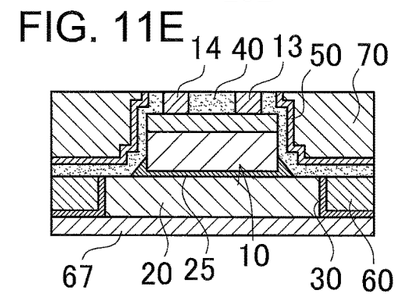

After the second protective member 70 is cured, as shown in FIG. 11E, the insulating member 40 covering the electrode formed surface 10B, the second metal layer 50, and the second protective member 70 are removed, thereby the pair of electrodes 13, 14 provided on the electrode formed surface 10B is exposed.

(7) Cutting

Figure 11F:
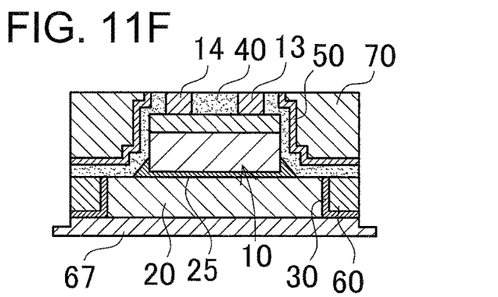
Figure 11G:
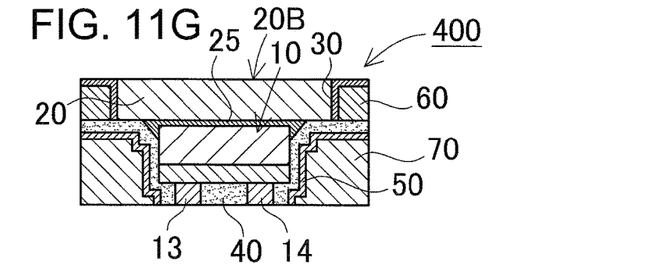

As shown in FIG. 11F, the first protective member 60 and the second protective member 70 are cut with a dicing blade or the like, so that the first metal layer 30 keeps covering the lateral surfaces of the light-transmissive member 20 and the second metal layer 50 keeps covering the lateral surfaces 10C of the light emitting element interposing the insulating member 40. This achieves downsizing of the light emitting device 100. After the desired outer shape is obtained by the cutting, as shown in FIG. 11G, the supporter 67 is removed and the light emitting device 400 is obtained.

The light emitting device and the method of manufacturing the same according to certain embodiments can be employed to applications that require extremely thin light emitting devices, such as backlight of a liquid crystal display. The light emitting device is applicable to an LED display such as large-screen televisions, billboards, advertisements, traffic information, 3D displays, lighting devices, and the like. The present disclosure is particularly suitable for achieving downsizing, cost-reduction, automatization, and design flexibility of the device.

The light emitting device according to certain embodiments of the present disclosure and a method of manufacturing the same are capable of reducing leakage of light from the lateral surfaces of the light emitting device.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a light emitting element comprising:
      a light extracting surface;
      an electrode formed surface opposite to the light extracting surface;
      one or more light emitting element lateral surfaces positioned between the light extracting surface and the electrode formed surface; and
      a pair of electrodes positioned on the electrode formed surface;
   a light-transmissive member that includes a light entering surface, a light exiting surface opposite to the light entering surface, and one or more light-transmissive member lateral surfaces positioned between the light entering surface and the light exiting surface, the light entering surface being disposed on the light extracting surface;
   an insulating member that covers the one or more light emitting element lateral surfaces and the electrode formed surface of the light emitting element, and is disposed to expose at least part of the pair of electrodes;
   a first metal layer that covers the one or more light-transmissive member lateral surfaces of the light-transmissive member; and
   a second metal layer that covers the one or more light emitting element lateral surfaces of the light emitting element interposing the insulating member.

2. The light emitting device according to claim 1, wherein the first metal layer covers an entire surface of the one or more light-transmissive member lateral surfaces of the light-transmissive member.

3. The light emitting device according to claim 1, wherein the first metal layer and the light-transmissive member are in contact with each other.

4. The light emitting device according to claim 1, further comprising
   a first protective member that includes a first surface, a second surface opposite to the first surface, and a through hole penetrating through the first surface and the second surface,
   wherein the first metal layer covers an inner surface of the through hole.

5. The light emitting device according to claim 4,
   wherein the first surface is positioned at the light exiting surface side,
   wherein the second surface is positioned at the light entering surface side, and
   wherein the first metal layer includes a cover that covers the first surface.

6. The light emitting device according to claim 4,
wherein the first surface is positioned at the light entering surface side,
wherein the second surface is positioned at the light exiting surface side, and
wherein the first metal layer includes a cover that covers the first surface.

7. The light emitting device according to claim 1, wherein the second metal layer and the insulating member are in contact with each other.

8. The light emitting device according to claim 1, further comprising
a second protective member that covers the one or more light emitting element lateral surfaces of the light emitting element interposing the second metal layer.

9. The light emitting device according to claim 1, wherein the first metal layer and the second metal layer are in contact with each other.

10. The light emitting device according to claim 1, wherein an outer shape of the light exiting surface is greater than an outer shape of the light extracting surface as seen in a plan view.

11. The light emitting device according to claim 1, wherein the light extracting surface and the light entering surface are disposed interposing a joining member.

12. The light emitting device according to claim 11, wherein the joining member covers the one or more light emitting element lateral surfaces of the light emitting element.

13. The light emitting device according to claim 1, wherein the light-transmissive member contains a wavelength conversion member.

14. The light emitting device according to claim 13, wherein particles of the wavelength conversion member are positioned in high density at the light entering surface side.

15. A method of manufacturing a light emitting device, the method comprising:
providing a covering member that includes
a light-transmissive member that includes a light entering surface, a light exiting surface opposite to the light entering surface, and one or more light-transmissive member lateral surfaces positioned between the light entering surface and the light exiting surface, and
a first metal layer that covers the lateral surfaces of the light-transmissive member;
joining a light extracting surface of a light emitting element and the light entering surface to each other, the light emitting element including the light extracting surface, an electrode formed surface opposite to the light extracting surface, one or more light emitting element lateral surfaces positioned between the light extracting surface and the electrode formed surface, and a pair of electrodes provided on the electrode formed surface;
forming an insulating member to cover the one or more light emitting element lateral surfaces and the electrode formed surface of the light emitting element;
forming a second metal layer on a surface of the insulating member; and
removing the insulating member and the second metal layer that cover the electrode formed surface to expose the pair of electrodes.

16. The method of manufacturing the light emitting device according to claim 15, wherein the providing the covering member includes:
providing a first protective member that includes a first surface, a second surface opposite to the first surface, and a through hole that penetrates through the first surface and the second surface;
forming the first metal layer at on inner surface of the through hole; and
forming the light-transmissive member in a region inside the first metal layer.

17. The method of manufacturing the light emitting device according to claim 16, wherein in the forming the first metal layer, forming the first metal layer on the first surface.

* * * * *